United States Patent
Narayan et al.

(10) Patent No.: US 6,486,526 B1
(45) Date of Patent: *Nov. 26, 2002

(54) CRACK STOP BETWEEN NEIGHBORING FUSES FOR PROTECTION FROM FUSE BLOW DAMAGE

(75) Inventors: Chandrasekhar Narayan, Hopewell Junction, NY (US); Edward W. Kiewra, Verbank, NY (US); Carl J. Radens, LaGrangeville, NY (US); Axel C. Brintzinger, Fishkill, NY (US)

(73) Assignees: International Business Machines Corporation, Armonk, NY (US); Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/223,826
(22) Filed: Jan. 4, 1999

Related U.S. Application Data (63) Continuation of application No. 09/223,826, filed on Jan. 4, 1999, now abandoned.

(51) Int. Cl.[7] .............................................. H01L 29/00
(52) U.S. Cl. .................................................... 257/529
(58) Field of Search .......................... 257/529; 438/601

(56) References Cited

U.S. PATENT DOCUMENTS

| | | | | |
|---|---|---|---|---|
| 4,197,555 A | * | 4/1980 | Uehara et al. | 257/70 |
| 4,383,165 A | * | 5/1983 | Smith et al. | 257/529 |
| 4,628,590 A | * | 12/1986 | Udo et al. | 257/529 |
| 5,244,836 A | * | 9/1993 | Lim | 257/529 |
| 5,279,984 A | | 1/1994 | Kinoshita et al. | 437/52 |
| 5,420,455 A | | 5/1995 | Gilmour et al. | 257/529 |
| 5,523,253 A | | 6/1996 | Gilmour et al. | 437/60 |
| 5,589,706 A | | 12/1996 | Mitwalsky et al. | 437/249 |
| 5,636,172 A | * | 6/1997 | Prall et al. | 365/225.7 |
| 5,661,331 A | | 8/1997 | Hebbeker et al. | 257/529 |
| 5,773,869 A | * | 6/1998 | Froehner | 257/529 |
| 6,008,716 A | * | 12/1999 | Kokubun | 257/529 |

\* cited by examiner

*Primary Examiner*—Tom Thomas
*Assistant Examiner*—Douglas W. Owens
(74) *Attorney, Agent, or Firm*—H. Daniel Schnurmann (57) ABSTRACT

A fuse structure in an integrated circuit chip is described that includes an insulated semiconductor substrate; a fuse bank integral to the insulated semiconductor substrate consisting of a plurality of parallel co-planar fuse links; and voids interspersed between each pair of the fuse links, the voids extending beyond a plane defined by the co-planar fuse links. The voids surrounding the spot to be hit by a laser beam during fuse blow operation act as a crack stop to prevent damage to adjacent circuit elements or other fuse links present. By suitably shaping and positioning the voids, a tighter pitch between fuses may be obtained.

7 Claims, 8 Drawing Sheets

FIG. 7a TOP VIEW

FIG. 7b SIDE VIEW

CRACK STOP BETWEEN NEIGHBORING FUSES FOR PROTECTION FROM FUSE BLOW DAMAGE

CROSS-REFERENCE TO RELATED PATENT APPLICATION

This is a Continuation Patent Application of U.S. patent application Ser. No. 09/223,826, filed on Jan. 4, 1999, now abandoned.

FIELD OF THE INVENTION

This invention relates to the fabrication of integrated circuits and, more particularly, to a method for protecting fuses from damage while at the same time increasing the fuse density (i.e., the number of fuses per unit area) when employing a laser beam to blow selected fuses forming a fuse bank.

BACKGROUND OF THE INVENTION

Semiconductor integrated circuits (IC) and their manufacturing techniques are well known in the art. In typical integrated circuits, large number of semiconductor devices are fabricated on a silicon substrate. To achieve the desired functionality, a plurality of conductors are typically employed for coupling selected devices together. In some integrated circuits, some of the conductive links or wires may be coupled to fuses, which may be selectively programmed (i.e., blown) after fabrication using lasers. By way of example, in a dynamic random access memory (DRAM), fuses may be employed during manufacturing to protect from destruction some of the gate stacks of the transistors from inadvertent built-up charges. Once the fabrication of the IC is substantially complete, the fuses may be blown or cut to permit the DRAM circuit to function as if the protective current paths never existed. More commonly, fuses may be employed to set an enable bit and address bits of a redundant array element in a DRAM circuit or for repairing defects found in the DRAM by appropriate replacement of defective elements with redundancy replacement elements present within or without the chip.

Figure 1:
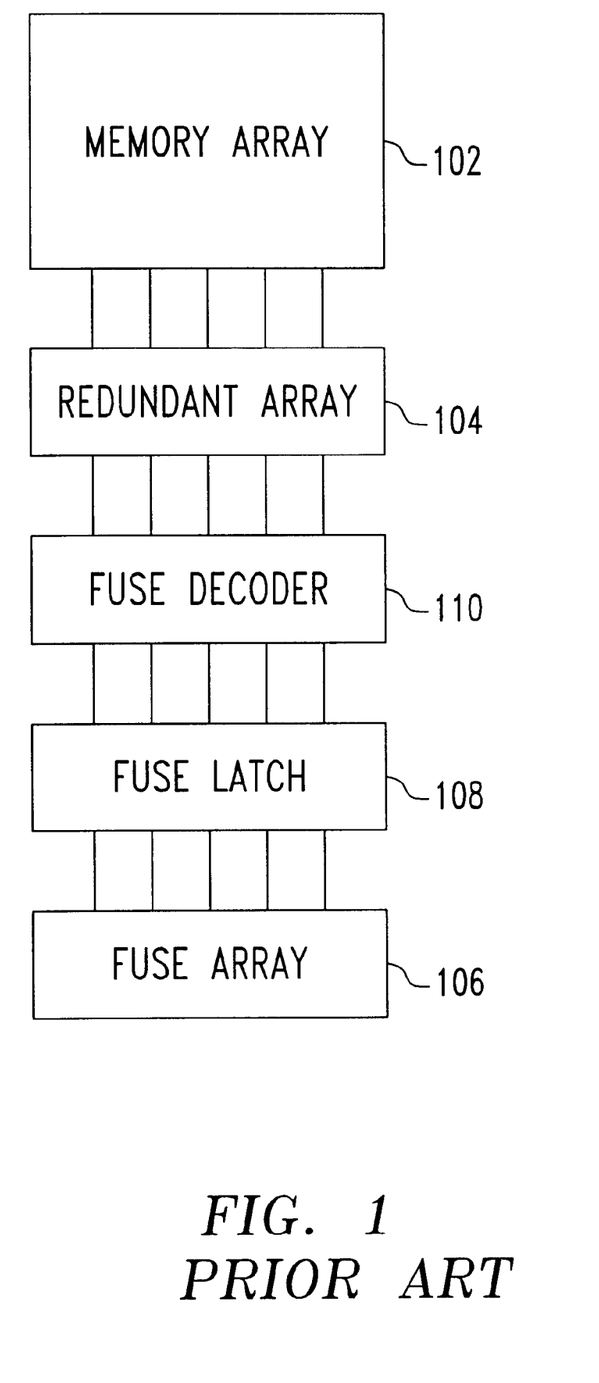
FIG. 1 illustrates a schematic block diagram of a typical DRAM, including a main memory array, a redundancy replacement array, a fuse decoder circuit, fuse latches, and fuses in a fuse array.

To facilitate discussion, FIG. 1 illustrates a typical dynamic random access memory (DRAM) integrated circuit, including a main memory array 102. To allow the replacement of a defective main array element within main memory array 102, a redundancy replacement array 104 is provided as shown. A plurality of fuses in fuse array 106 are coupled to redundancy array 104 via a fuse latch array 108 and a fuse decoder circuit 110. In order to replace a defective main memory array element, individual fuses in fuse array 106 may be blown or cut by setting their values to either a binary 1 or 0 as dictated by the decoder circuit. During this operation, the values of the fuses in fuse array 106 are typically loaded into the fuse latch array 108 when power is turned on. These values are then decoded by fuse decoder circuit 110 during run time, thereby facilitating the replacement of selected defective memory array elements with specific redundancy elements which are part of the redundancy array 104. Techniques for replacing failed main memory array elements with redundant array elements are well known in the art and will not be discussed in great detail here for brevity sake.

As previously mentioned, the fuse links within fuse array 106 may be selectively blown or programmed with a laser beam. Once blown, the fuse changes from a highly conductive state to a highly resistive (i.e., non-conductive) state, since a programmed fuse inhibits current from flowing through it and represents an open circuit to the path taken by the current.

Figure 2A:
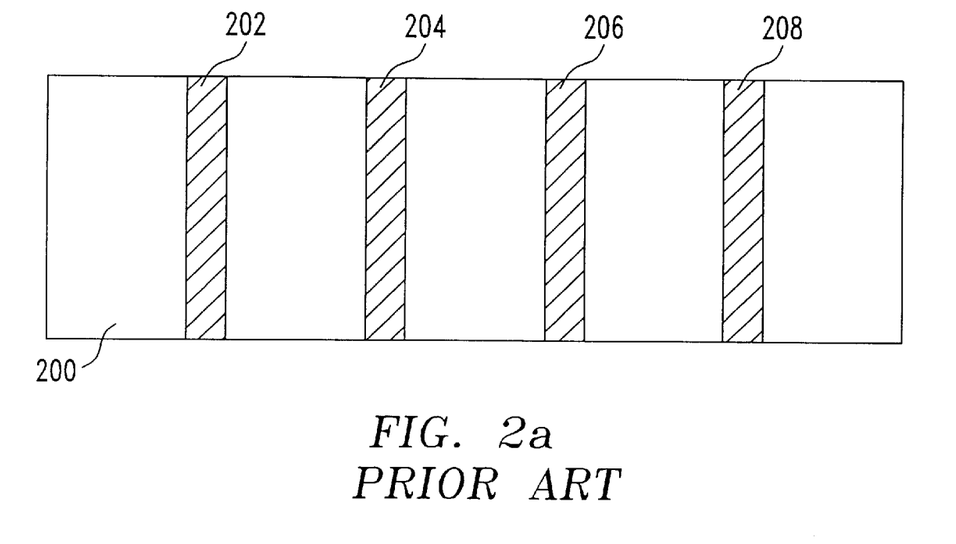
FIG. 2a illustrates a typical arrangement of a plurality of fuse links of the fuse bank in their original unblown state.

With reference to FIG. 2a, a fuse bank 200 is shown having a plurality of fuse links, such as 202, 204, 206, and 208, (represented in FIG. 1 as fuse array 106), are shown in their original unblown, i.e., conductive state.

Figure 2B:
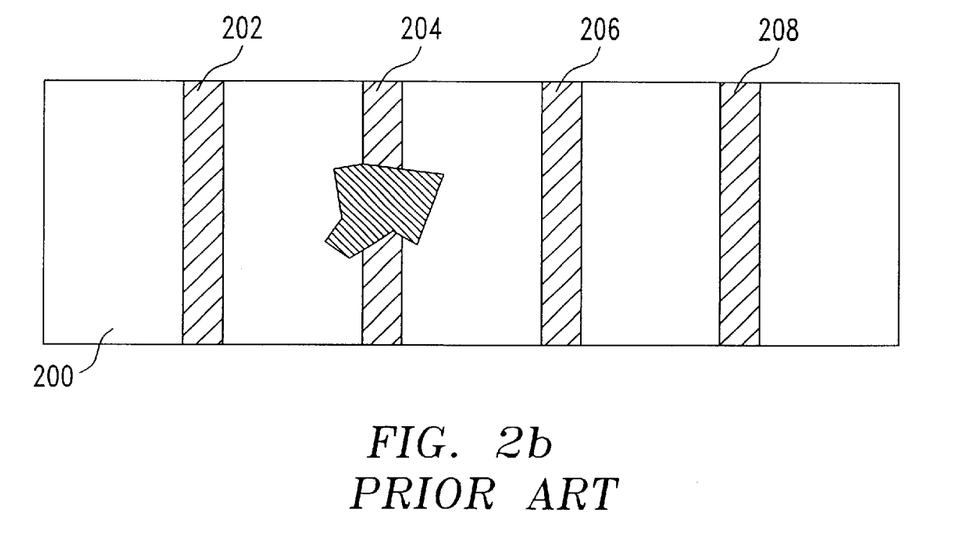
FIG. 2b shows one of the fuse links depicted in FIG. 2a blown by a laser beam.

In FIG. 2b, a laser beam has been employed to cut or blow fuse link 204, thereby inhibiting the flow of current therethrough. If the fuses are placed too closely together for a given laser wavelength and spot size, i.e., by deleting the fuse, an adjacent fuse link may inadvertently be blown or cut, rendering the IC defective or, at best, a possibility exists of causing damage to neighboring fuses during the fuse blow process. This is because the damage zone around a blown fuse is typically larger than the fuse itself in view of a number of factors, such as the laser spot size, thereby damaging the passivation layer over the fuses which extend outward from the fuses. Clearly many factors enter in determining the severity of the damage caused by laser beam, e.g., the amount of energy carried by the beam, its wavelength and the diameter of the beam.

Figure 3A:
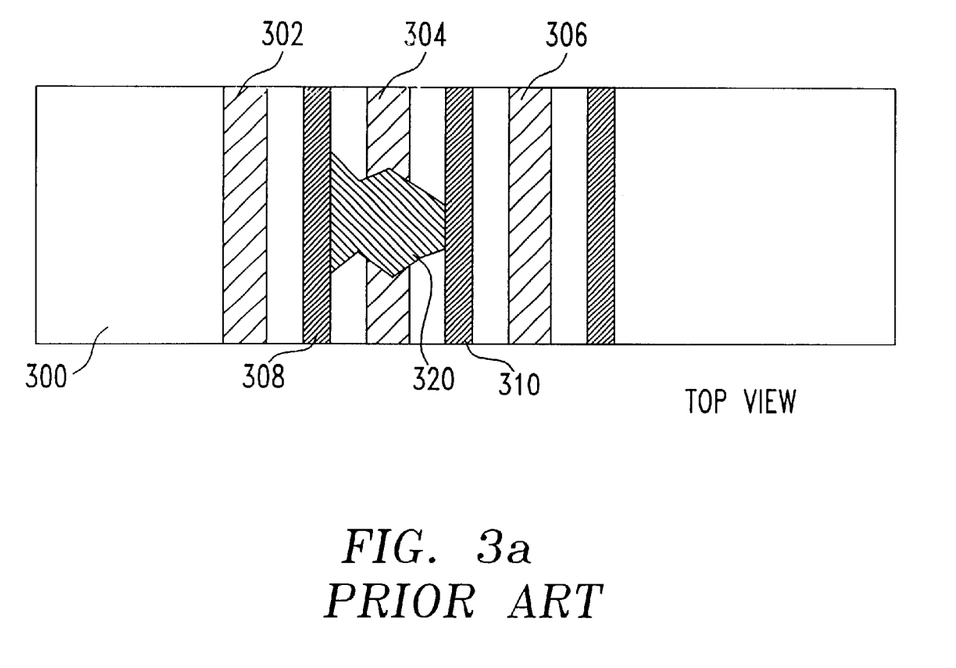
FIGS. 3a and 3b, respectively show a top view and a side view of a conventional fuse bank made of a plurality of fuses, wherein additional structures are placed within the fuse bank between the fuses, acting as crack stops when a fuse is blown with the laser.

In FIG. 3a, there is shown a typical fuse bank 300 consisting of fuses 302, 304, and 306. Additional structures, e.g., 308 and 310, are placed within the fuse bank and between the fuses. These structures, formed by barrier material, typically tungsten or molybdenum, act as crack stops when fuse 304 is blown by a laser beam (not shown). Further exhibited are cracks 320 propagating from fuse 304 and stopping at crack stop 308 and 310.

Figure 3B:
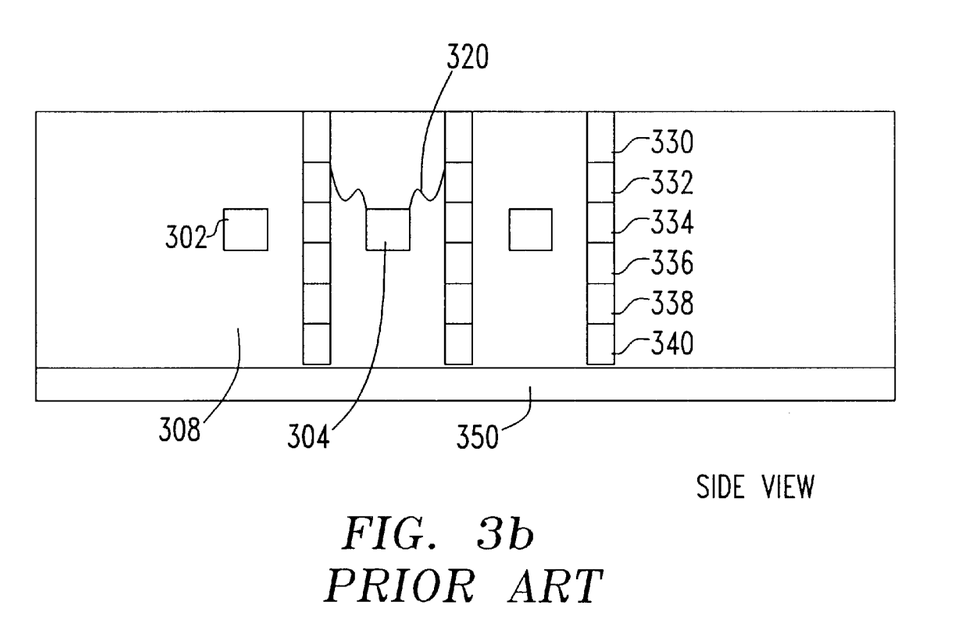

In another view of the same structure (FIG. 3b), a top view of the above structure built on a substrate 350 is illustrated. Only two fuses, i.e., 302 and 304, are exhibited. The crack stop is made up of several layers 330 through 340 which coincide with the several levels of wiring used in the fabrication process of the semiconductor chip. Once again, the cracks 320 are arrested by the crack stop, preferably made of portions of refractory metal.

Several other methods of protecting fuses have been advanced for protecting fuse elements to ensure that the fuse remains unaffected when the fuse blows open. In one example described in U.S. Pat. Nos. 5,420 455 and 5,523, 253, both issued to Gilmour et al. on Mar. 31, 1994 and May 30, 1995, respectively, a deposition of metal having a melting point higher than the melting point of the fuses is interspersed between the fuses. Such metals include tungsten and molybdenum. These barriers are resistant to cracking and are designed to prevent any cracks from propagating to other adjacent fuses in the immediate neighborhood. The bodies of barrier material are positioned such that they extend from the top surface of the layer containing the fuse links to approximately half-way down to the mid-point of the thickness of the fuse link.

The structure described by Gilmour et al. suffers from a major drawback, in that it requires specialized metals, oftentimes undesired ones due to manufacturing process considerations and/or they suffer from unwanted characteristics which may adversely affect the integrity of the circuits making the integrated chip. Another drawback resides in the added requirement of process alterations necessitated by the presence of certain refractory metals which tend to increase the cost of the product, rendering them uneconomical. Yet a further drawback resides in the presence of conductive paths provided by the presence of portions of barrier metal which may, under certain circumstances, alter the electrical characteristics of the circuits forming the IC chip. Finally, the introduction of a metallic crack stop between fuse links as described by Gilmour et al. will also not work at tight pitches, since the crack stop itself will be ablated by the laser, causing damage to fuses or circuit elements next to it.

OBJECTS OF THE INVENTION

Accordingly, it is an object of the invention to provide an improved fuse structure and method for fabricating integrated circuits having laser fuse links.

It is another object of the invention to provide an improved fuse structure and a method therefor, which advantageously allows more fuses to be concentrated into a given space by reducing the distance (pitch) between adjacent fuses.

It is still another object to prevent either the energy inherent of a laser beam or the damage caused by the fuse blowing, to reach or affect any adjacent fuse links or circuit elements in the immediate vicinity of the fuse link being programmed.

It is a further object to protect fuse links which span over several wiring layers when at least some of the fuse links within the structure are programmed by a laser beam.

SUMMARY OF THE INVENTION

In one aspect of the invention, the damage done to areas surrounding fuses packed closely together is limited by creating material discontinuities in the form of voids between fuses which will act as crack arresting structures. These "crack stops" can then be used in various configurations to contain the extent of damage around a blown fuse.

In another aspect of the invention, an integrated circuit is designed to include additional structures characterized by the absence of material, and placed between fuses and parallel to the fuses. The laser fuse link is configured to be set by a laser beam during fabrication of the integrated circuit.

In yet another aspect of the invention, these crack stops are positioned immediately surrounding the region of the fuses blown on a fuse link.

In one embodiment of the invention, there is provided a fuse structure including: an insulated semiconductor substrate; a fuse bank integral to the insulated semiconductor substrate consisting of a plurality of parallel co-planar fuse links; and voids interspersed between each pair of the fuse links, the voids extending beyond a plane defined by the co-planar fuse links.

In another embodiment of the invention, there is provided a fuse structure integral to a semiconductor substrate including: a fuse bank integral to the semiconductor substrate and consisting of a plurality of co-planar fuse links, each of the fuse links being provided with a co-planar area extending beyond the width of the fuse link; and voids positioned within the semiconductor substrate and interspersed between each pair of the fuse links surrounding the co-planar areas.

In a third embodiment of the invention there is provided a fuse structure integral to a semiconductor substrate providing support to a plurality of stacked insulated wiring layers including: integral to a first one of the stacked insulated wiring layers, a fuse bank comprising at least two co-planar rows of fuse links; integral to a second one of the stacked insulated wiring layers, a conducting bus positioned in a direction transversal to the direction of at least the two rows of fuse links; and portions of conductive material placed between the at least two rows of fuse links and running in a direction parallel to the bus.

In another aspect of the invention, there is provided a method of forming a fuse structure integral to a semiconductor substrate supporting a plurality of stacked insulated wiring layers which includes the steps of: providing to a first one of the stacked insulated wiring layers a fuse bank comprising at least two co-planar rows of fuse links; providing to a second one of the stacked insulated wiring layers, a conducting bus positioned in a direction transversal to the direction of the at least two row of fuse links; and placing portions of conductive material between the at least two rows of fuse links and running in a direction parallel to the bus.

BRIEF DESCRIPTION OF THE DRAWINGS

These and other aspects, features and advantages of the present invention will become apparent in the following detailed description of preferred embodiments when taken in conjunction with the accompanying drawings.

DESCRIPTION OF THE PREFERRED EMBODIMENT

Figure 4A:
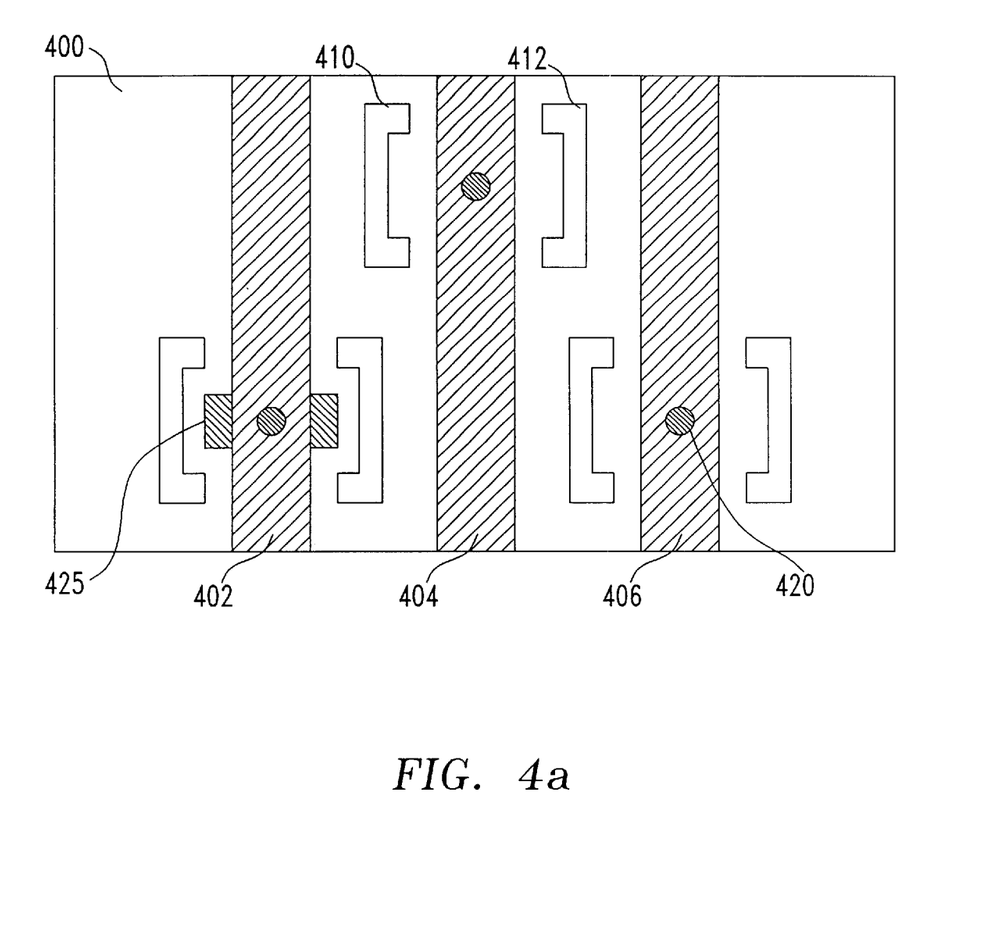
FIG. 4a shows air crack stops positioned in the area immediately surrounding the exact spot where the fuse link is blown by the laser, wherein the area surrounding the spot is widened beyond the width of the fuse, in accordance with one aspect of the invention.

In a first embodiment of the invention shown in FIG. 4a, the crack stop is positioned in the immediate vicinity of the region where the fuse link is to be blown by the laser (depicted by a dark spot, e.g., point 420).

A plurality of fuses 402, 404 and 406 form the fuse bank 400. Surrounding, e.g., fuse 402, are depicted two crack stops 410 and 412 centered around point 420—the target spot for the laser to hit the fuse during the blow operation. Further illustrated, are shown the spots staggered along the length of the respective fuse links, each spot being surrounded by its own crack stop. This configuration is a representation of an instance wherein staggered crack stops can be beneficial in reducing the fuse pitch. Although the crack stop is shown in the shape of a bracket, many other shapes and positions can be envisaged to achieve the same goal. By way of example, the crack stop can be formed by longitudinal portions only without any transverse components.

The configuration shown can be modified by having the exact spot selected for each fuse link to be advantageously surrounded by an area extending beyond the boundaries defining the width of the fuse link, as shown by square 425. This extension has the advantage of absorbing an added amount of the energy emitted by the laser beam during the blowing operation. Its drawback, though, is that it may interfere with obtaining a closer pitch than that would have been possible in the absence of such metal extensions 425.

Figure 4B:
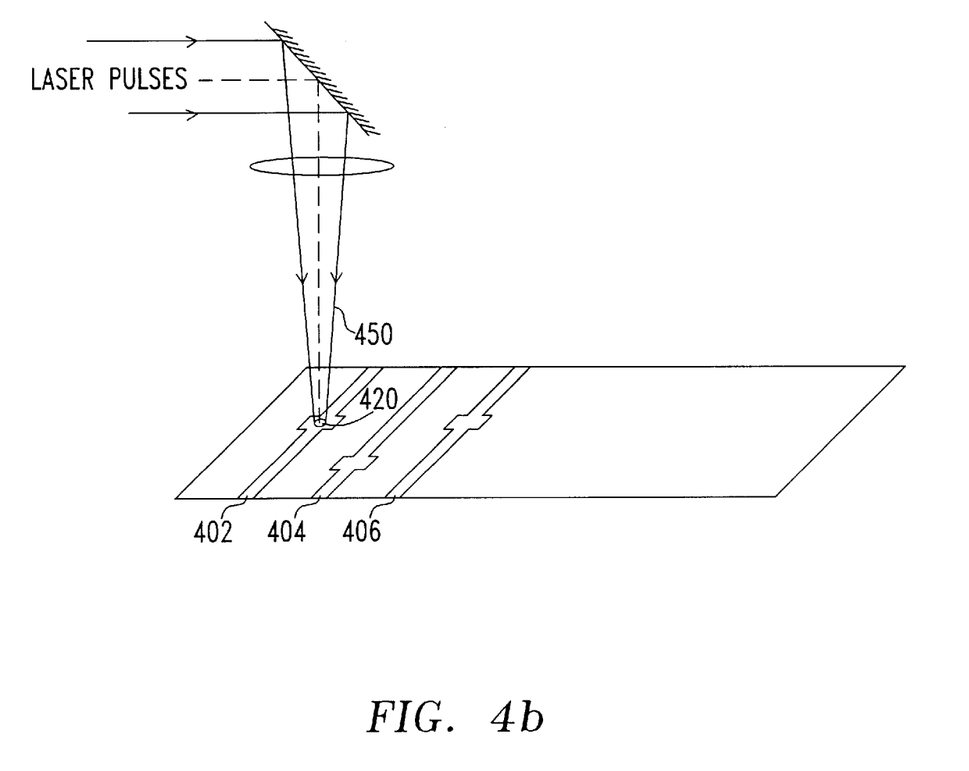
FIG. 4b is a schematic diagram of a laser beam hitting a spot during a fuse blow operation.

Shown in FIG. 4b is a schematic diagram of a laser beam 450 hitting spot 420 of fuse link 402. Each fuse link is shown being provided with the aforementioned area surrounding the spot. For simplicity sake, no crack stops are shown.

In conventional designs, fuse links placed in a row inside a fuse bank cannot be reliably used when fuse pitches (i.e., distance between adjacent fuses) fall below approximately 3 $\mu$m. This is because lasers that are typically used for blowing fuses have a wavelength of the order of 1–1.3 $\mu$m. As a result, the smallest spot that can be focused is greater than 2–2.6 $\mu$m. This, coupled with the uncertainty associated with the positioning of the substrate relative to the laser spot renders the blowing of fuses an unreliable operation. For fuse pitches less than 3 $\mu$m, the probability of damaging a neighboring fuse increases as the pitch decreases. The introduction of a metallic crack stop between fuse links as described by Gilmour et al. will also not work at these tight pitches, since the crack stop itself will be ablated by the laser, causing damage to fuses or circuit elements next to it. In the invention herein described, since the crack stop is made by removing material, there is no possibility of damage by the laser beam to the crack stop. This makes it possible to pack fuses even down to a pitch of 2.2 $\mu$m without damaging neighboring fuses during fuse blow. Moreover, the crack stop still performs the function of stopping cracks from damaging neighboring fuses.

Figure 5:
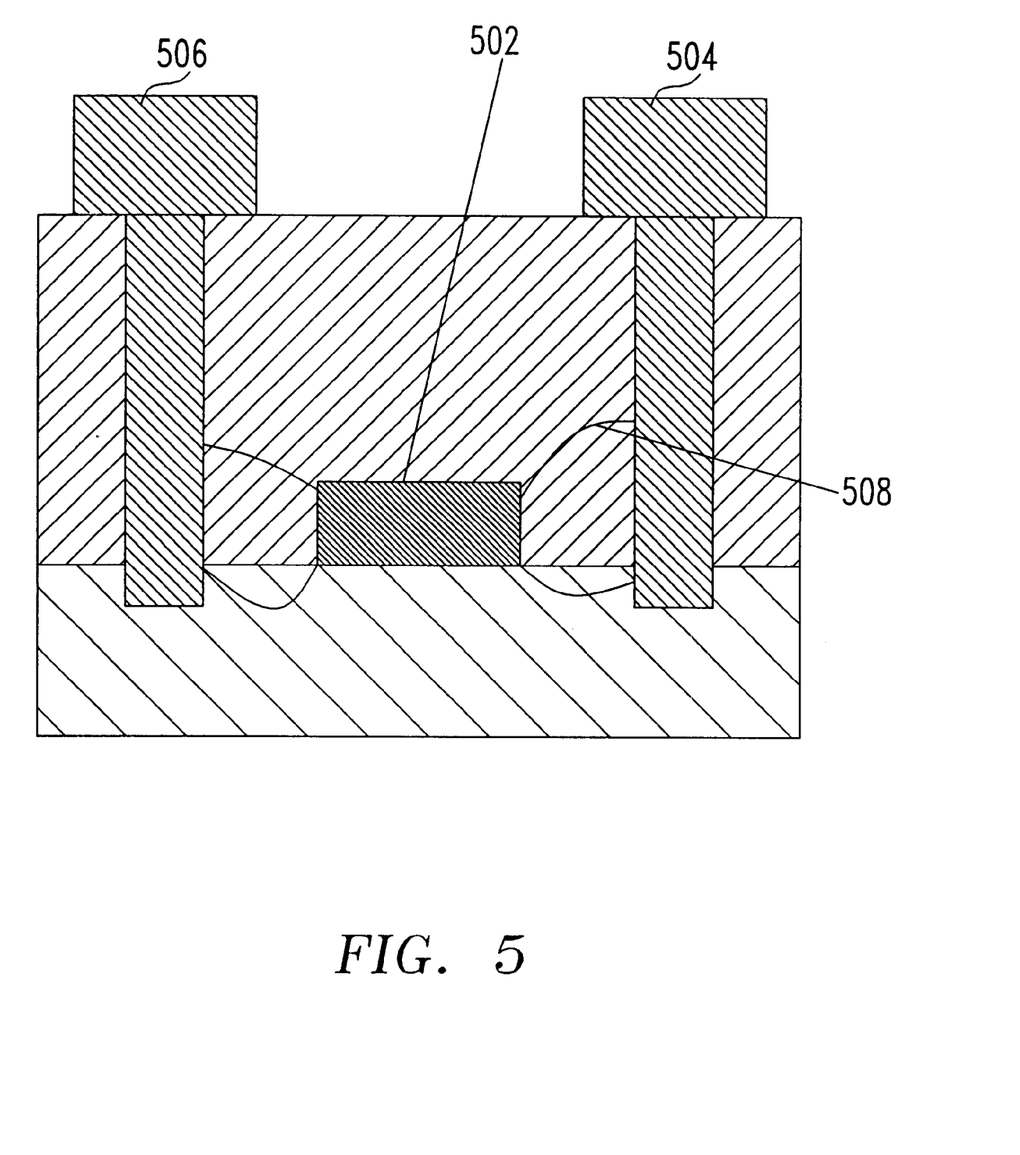
FIG. 5 shows a cross-sectional view of the fuse structure, wherein cracks-are shown surrounding the fuse ready to be blown.

FIG. 5 shows a cross-sectional view of the structure. The fuse 502 is shown embedded in a substrate with two crack stops 504 and 506, preferably made of air, in order to minimize the drawbacks found in the prior art and which were described previously. Cracks 508 are depicted arrested by crack stops 504 and 506.

Referring now to FIGS. 6a–6e, a description follows of the various steps applicable to the manufacturing of an air crack stop. A dielectric or passivation film C1 is initially deposited on top of a silicon substrate (not shown). This is followed by a metal (M1) deposition. The fuse element M1 can be formed using standard etch and lithographic means. Subsequently, a second dielectric or passivation film C2 is deposited. Chemical-mechanical polishing (CMP) can advantageously be performed, if so desired or required. The dielectric C2 is etched to make contact to other metal structures present on level M1.

Figure 6A:
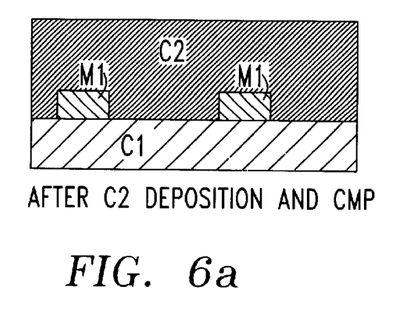
FIGS. 6a–6e show the various process steps required to manufacture an air crack stop, in accordance with the invention.
Figure 6B:
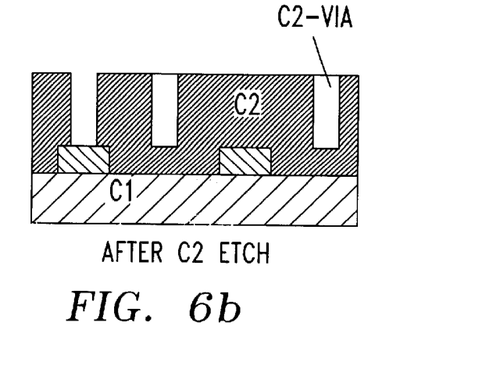
Figure 6C:
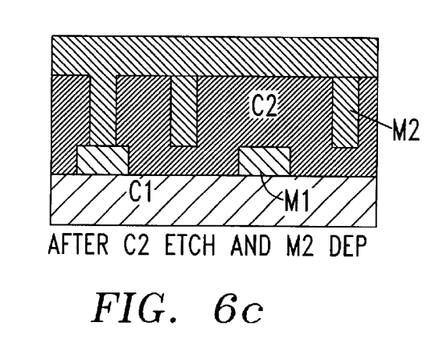

Referring now to FIG. 6b, a modification of the mask allows for the formation of the air crack stop trench as indicated. Normally, this is followed by a final metallization level M2, as shown in FIG. 6c, wherein the vias are filled with a blanket deposition of conductive material. This means that the trenches will be refilled with metal M2. However, since M2 will be patterned and etched it is preferable to remove metal M2 from the air crack stop trenches. It is also possible not to remove metal M2 from the trenches by modifying the M2 mask in an appropriate manner. Using this approach, one can form metal crack stop trenches instead of air crack stop trenches.

Figure 6D:
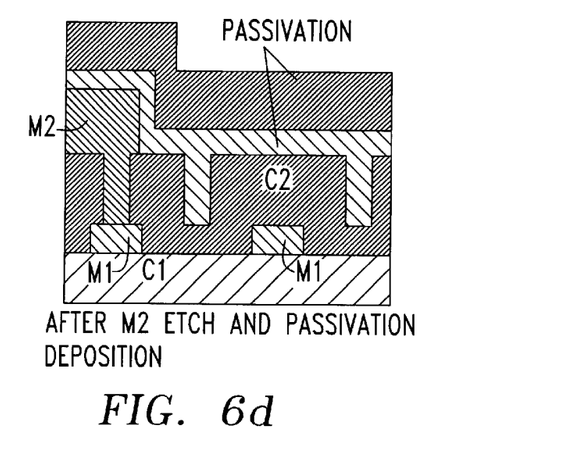
Figure 6E:
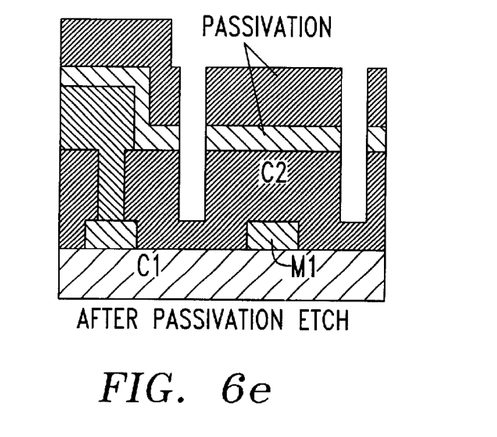

The final process of chip manufacturing, illustrated in FIG. 6d, consists of a passivation step using a dielectric. and a buffer coating in order to prevent the chip from scratching or humidity uptake. In case of the air crack stop, the application of passivation again fills the air crack stop trenches with material. However, as in the case of metal M2, this material is removed because of the existence of the very last etch step that is used to open windows, i.e., air crack stop trench, which is required in order to blow fuses by way of a laser beam (FIG. 6e).

Figures 7A, 7B:
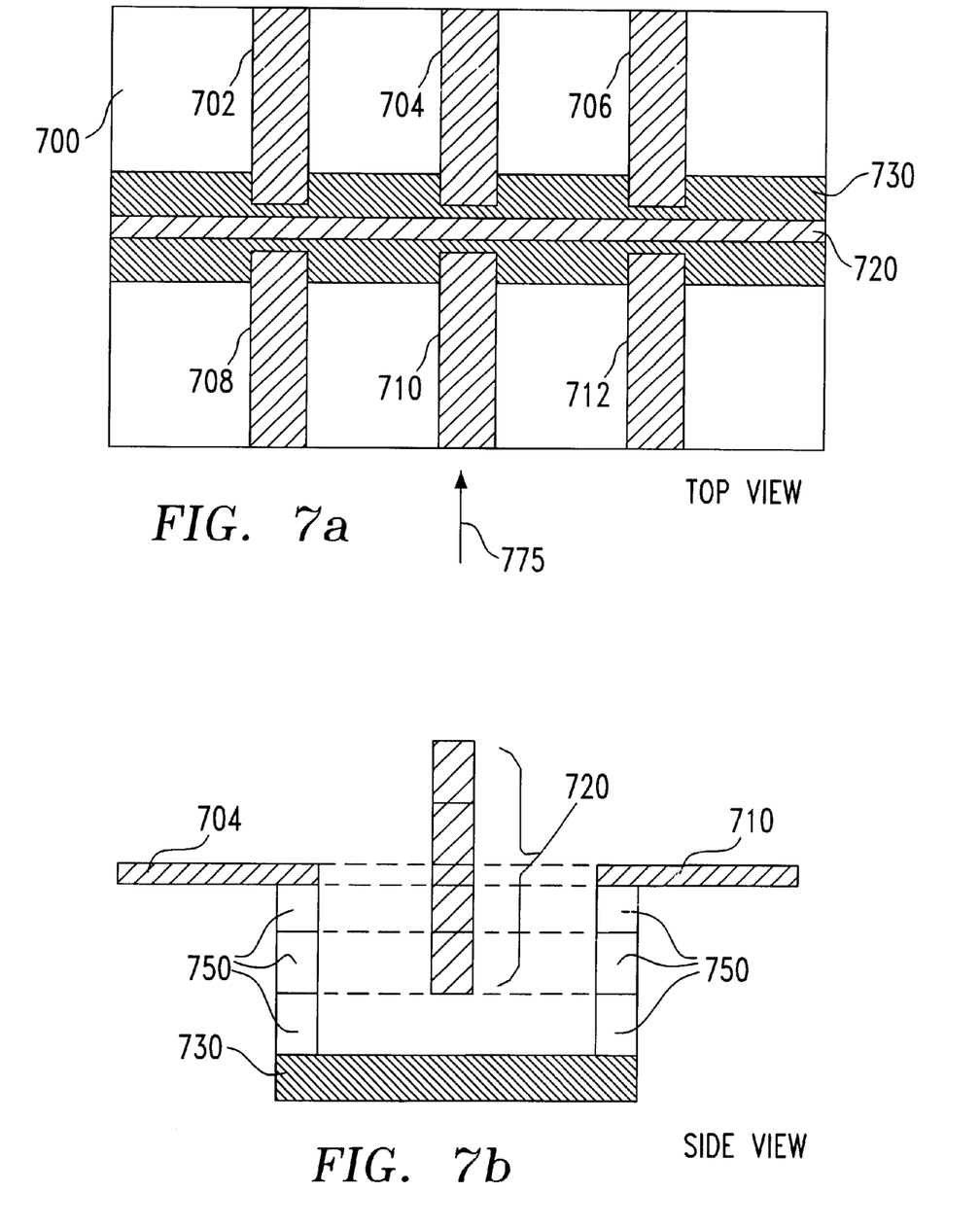
FIGS. 7a and 7b respectively show a top and side representation of a second embodiment of the invention, wherein two row of fuses are provided with a crack stop wall separating them in an integrated circuit having a plurality of insulated wiring layers.

Referring now to FIGS. 7a and 7b, respectively showing a top and side representation of a second embodiment of the invention, two row of fuses are shown provided with a crack stop wall separating them.

A fuse bank 700 is provided with fuses 702, 704 and 706 in one row, and fuses 708, 710, and 712 in a second row within the same bank 700. The crack stop is shown with reference to numeral 720. When the rows share a common electrical bus 430 set to separate them (a top and a bottom strip), the crack stop is inhibited from running from the top surface down to the substrate because of the requirement to electrically connect the two rows. FIG. 7b illustrates the cross-sectional view of FIG. 7a taken at a location depicted by numeral 775, where fuse 702 is shown connected to fuse 708 through the bottom layer 430 used as a common electrode. The crack stop 720 is preferably made up of only the layers above 730 and which are not in contact with them. The crack stop (e.g., 720) can be designed to have one of its ends make electrical contact with the bus 430 or, if so desired, it can be kept separate from the bus altogether. The metal segments referenced globally by numeral 750 join common electrical bus 730 to fuses 704 and 710. By way of example, referring to FIG. 6d, those segments are C1, M1, M2 and C2.

Whereas the invention has been described with respect to several embodiments, it will be apparent to those skilled in the art that these embodiments are intended only as illustrative examples only and that various changes and modifications may be incorporated without departing from the scope of the invention as set forth by the following claims.

What is claimed is:

1. A fuse structure comprising:

two rows of opposed co-planar parallel fuses, wherein one or more of said co-planar parallel fuses in a first row is respectively opposed by a corresponding one of said co-planar parallel fuses in a second row, said first row and said second row being separated from each other by a crack stop wall transversal to the direction of said parallel fuses.

2. A fuse structure comprising:

two tows of opposed co-planar parallel fuses, and a crack stop wall positioned in a direction orthogonal to the length of said opposed parallel fuses, said crack stop wall separating the first row of said co-planar parallel fuses from the second row of said co-planar parallel fuses, said crack stop wall absorbing energy emitted by a laser beam during a fuse blow operation.

3. The fuse structure as recited in claim 2, wherein a void replaces said crack stop wall, said void being air.

4. A fuse structure formed by a plurality of stacked insulated wiring layers comprising:

integral to a first one of said stacked insulated wiring layers two rows of opposed co-planar parallel fuses;

integral to a second one of said stacked insulated wiring layers, a crack stop wall positioned in a direction transversal to said opposed co-planar parallel fuses, said crack stop wall separating the first row of said co-planar parallel fuses from the second row of said co-planar parallel fuses, said crack stop wall absorbing energy emitted by a laser beam during a fuse blow operation.

5. The fuse structure as recited in claim 4, wherein a void replaces said crack stop wall.

6. The fuse structure as recited in claim 4, wherein said crack stop wall extends between said two rows of stacked insulated wiring layers.

7. The fuse structure as recited in claim 4, wherein said crack stop wall is made of conductive material.

* * * * *